(12) United States Patent
Cherubini et al.

(10) Patent No.: US 10,587,289 B2
(45) Date of Patent: *Mar. 10, 2020

(54) SEQUENCE DETECTORS

(71) Applicant: INTERNATIONAL BUSINESS MACHINES CORPORATION, Armonk, NY (US)

(72) Inventors: Giovanni Cherubini, Rueschlikon (CH); Roy D. Cideciyan, Rüschlikon (CH); Simeon Furrer, Altdorf (CH); Thomas H. Toifl, Gattikon (CH); Hazar Yueksel, Kilchberg (CH)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/148,016

(22) Filed: Oct. 1, 2018

(65) Prior Publication Data

US 2019/0036551 A1 Jan. 31, 2019

Related U.S. Application Data

(63) Continuation of application No. 15/251,638, filed on Aug. 30, 2016, now Pat. No. 10,243,591.

(51) Int. Cl.
*H03M 13/39* (2006.01)
*H03M 13/25* (2006.01)
(Continued)

(52) U.S. Cl.
CPC ..... *H03M 13/3961* (2013.01); *H03M 13/256* (2013.01); *H03M 13/3955* (2013.01);
(Continued)

(58) Field of Classification Search
CPC .......... H03M 13/3961; H03M 13/256; H03M 13/3955; H04L 1/0045
See application file for complete search history.

(56) References Cited

U.S. PATENT DOCUMENTS 5,331,665 A 7/1994 Busschaert et al.
5,508,752 A 4/1996 Kim et al.
(Continued)

OTHER PUBLICATIONS

List of IBM Patents or Patent Applications Treated as Related; Date Filed: Oct. 1, 2018, 2 pages.
(Continued)

*Primary Examiner* — Guy J Lamarre
(74) *Attorney, Agent, or Firm* — Cantor Colburn LLP; Daniel Morris

(57) ABSTRACT

Sequence detectors and detection methods are provided for detecting symbol values corresponding to a sequence of input samples obtained from an ISI channel. The sequence detector comprises a branch metric unit (BMU) and a path metric unit (PMU). The BMU, which comprises an initial set of pipeline stages, is adapted to calculate, for each input sample, branch metrics for respective possible transitions between states of a trellis. To calculate these branch metrics, the BMU selects hypothesized input values, each dependent on a possible symbol value for the input sample and L>0 previous symbol values corresponding to possible transitions between states of the trellis. The BMU then calculates differences between the input sample and each hypothesized input value. The BMU compares these differences and selects, as the branch metric for each possible transition, an optimum difference in dependence on a predetermined state in a survivor path through the trellis.

20 Claims, 12 Drawing Sheets

(51) Int. Cl.
*H04L 1/00* (2006.01)
*H04L 25/03* (2006.01)
*H03M 13/41* (2006.01)

(52) U.S. Cl.
CPC ............ *H04L 1/006* (2013.01); *H04L 1/0052* (2013.01); *H04L 1/0054* (2013.01); *H04L 25/03* (2013.01)

(56) References Cited

U.S. PATENT DOCUMENTS

| | | | |
|---|---|---|---|
| 5,530,707 A * | 6/1996 | Lin | H03M 13/3961 714/792 |
| 6,631,494 B2 | 10/2003 | Patapoutian | |
| 6,731,699 B2 | 5/2004 | Pozidis et al. | |
| 6,999,521 B1 * | 2/2006 | Azadet | H04L 25/03197 375/262 |
| 7,277,506 B1 | 10/2007 | Pope et al. | |
| 7,555,070 B1 | 6/2009 | Ulriksson et al. | |
| 7,738,602 B2 | 6/2010 | Langenbach et al. | |
| 8,069,401 B2 | 11/2011 | Pisek et al. | |
| 8,073,083 B2 | 12/2011 | Bliss et al. | |
| 8,085,883 B2 | 12/2011 | Hegde et al. | |
| 8,111,767 B2 | 2/2012 | Gezici et al. | |
| 8,122,327 B2 | 2/2012 | Shao et al. | |
| 8,483,343 B2 | 7/2013 | Agazzi et al. | |
| 8,644,372 B1 | 2/2014 | Riani et al. | |
| 8,699,557 B2 | 4/2014 | Haratsch et al. | |
| 8,875,000 B2 | 10/2014 | Chilappagari et al. | |
| 8,938,035 B1 | 1/2015 | Dai et al. | |
| 9,112,661 B1 | 8/2015 | Venkataraman | |
| 9,172,502 B2 | 10/2015 | Asahina | |
| RE45,887 E | 2/2016 | Choi et al. | |
| 9,942,005 B2 | 4/2018 | Cherubini et al. | |
| 2001/0025358 A1 | 9/2001 | Eidson et al. | |
| 2003/0007578 A1 | 1/2003 | Kuo et al. | |
| 2004/0158542 A1 | 8/2004 | Bruls | |
| 2005/0141629 A1 | 6/2005 | Markman | |
| 2005/0278605 A1 | 12/2005 | Xu et al. | |
| 2007/0124652 A1 | 5/2007 | Litsyn et al. | |
| 2007/0277081 A1 | 11/2007 | Liao | |
| 2008/0189532 A1 * | 8/2008 | Haratsch | H04L 25/03235 712/239 |
| 2009/0187813 A1 | 7/2009 | Haratsch | |
| 2011/0307767 A1 | 12/2011 | Kelin et al. | |
| 2014/0177767 A1 | 6/2014 | Azadet et al. | |
| 2018/0062671 A1 | 3/2018 | Cherubini et al. | |
| 2018/0062790 A1 | 3/2018 | Cherubini et al. | |
| 2018/0198558 A1 | 7/2018 | Cherubini et al. | |

OTHER PUBLICATIONS

Chen, "Modified VLSI Designs for Error Correction Codes", Thesis Submitted to Oregon State University for the Degree of Master of Science, Sep. 2007, 67 Pages.

E. F. Haratsch et al., "A 1-Gb/s Joint Equalizer and Trellis Decoder for 1000BASE-T Gigabit Ethernet", IEEE Journal of Solid-State Circuits, 36(3), 2001, pp. 374-384.

Garga, "Flexible constraint length Viterbi decoders on large wire-area interconnection topologies", Thesis Submitted for the Degree of Master of Science (Engineering) in the Faculty of Engineering, Centre for Electronics Design and Technology, Indian Institute of Science, Jul. 2009, 130 Pages.

IEEE Standard for Ethernet, IEEE 802.3, 2012.

M. Hatamian et al., "Design Considerations for Gigabit Ethernet 1000Base-T Twisted Pair Transceivers", In Custom Integrated Circuits Conference, 1998, Proceedings of the IEEE, pp. 335-342.

Singh, "Reliable Low-Latency and Low-Complexity Viterbi Architectures Benchmarked on ASIC and FPGA", Thesis/Dissertation Collections, Rochester Institute of Technology RIT Scholar Works, 2015, 51 pages.

Vestias et al., "Design of High-Speed Viterbi Decoders on Virtex-6 FPGAs", 2012 15th Euromicro Conference on Digital System Design, IEEE, 2012, pp. 938-945.

* cited by examiner

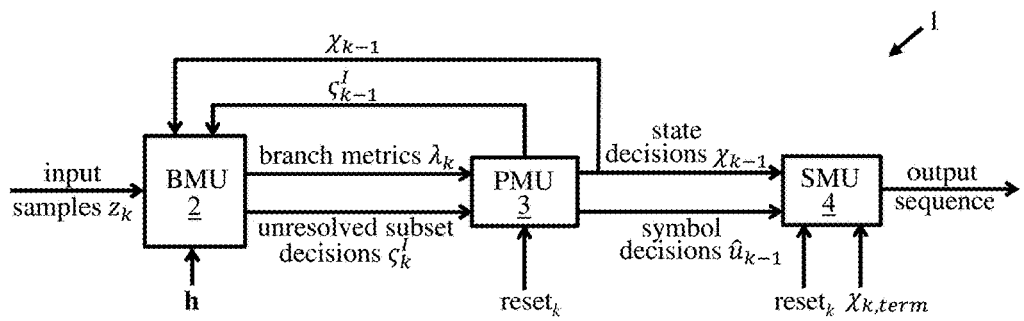
Figure 1
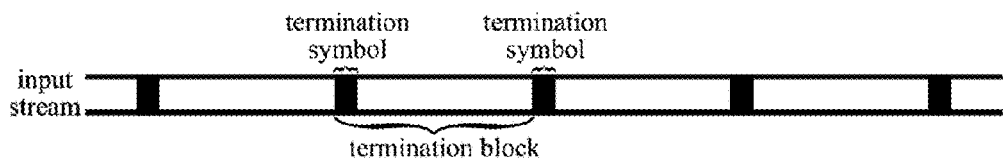
Figure 2
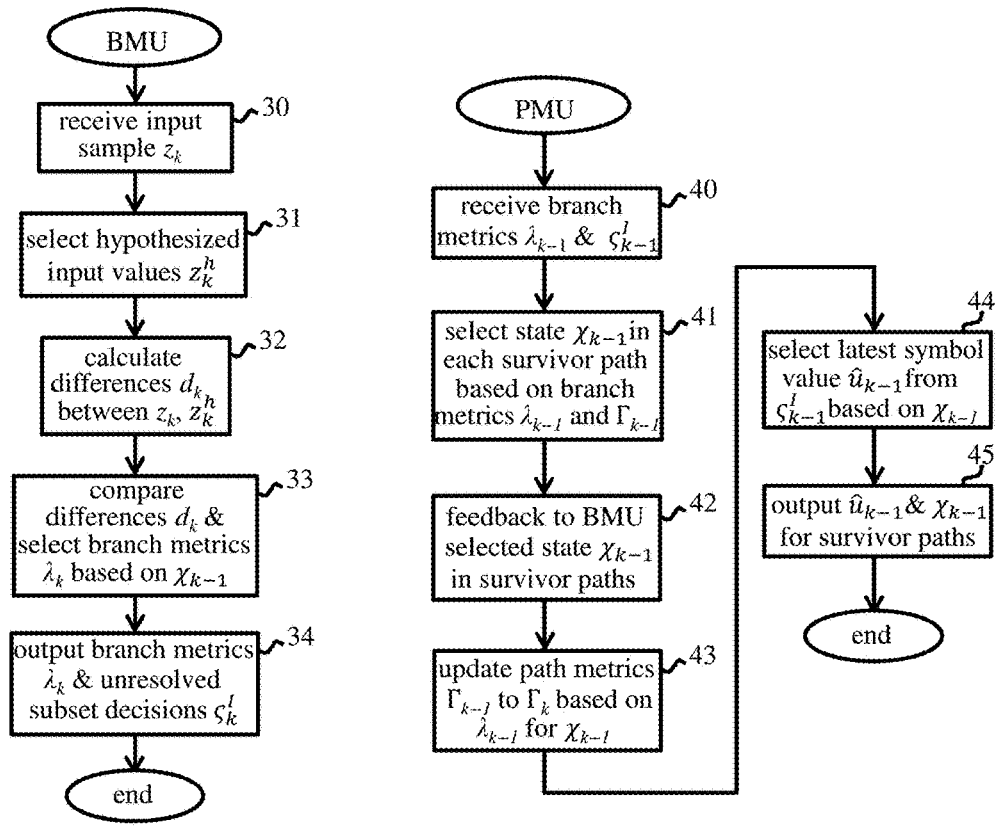
Figure 3
Figure 4

US 10,587,289 B2

SEQUENCE DETECTORS

DOMESTIC PRIORITY

This application is a continuation of and claims priority to U.S. patent application Ser. No. 15/251,638, filed on Aug. 30, 2016, entitled "SEQUENCE DETECTORS". The entire content of the aforementioned application is incorporated herein by reference.

BACKGROUND

The present invention relates generally to sequence detectors, and more particularly to apparatus and methods for detecting symbol values corresponding to a sequence of input samples obtained from a channel.

Sequence detectors are used for detecting a sequence of data symbols which has been communicated over a channel whose output is sampled at the receiver. For a given sample sequence obtained from a channel, the aim of such detectors is to determine the most likely symbol values for the symbol sequence supplied to the channel input. In data transmission, a sequence of input symbols drawn from a signal constellation is typically used to modulate some continuous waveform which is transmitted through a dispersive channel and sampled at the receiver. These samples would ideally equal the corresponding input symbols. However, they are corrupted by noise and interference with neighboring transmitted symbols. The latter phenomenon is commonly referred to as intersymbol interference (ISI). Sequence detectors such as Viterbi detectors (also called "Viterbi decoders") use recursive methods to determine the most probable input symbol sequence. Such detectors for high-speed data transmission over ISI channels play a vital role in designing receivers in compliance with recently approved communications standards, e.g. the IEEE P802.3bj standard for 100 Gb/s Ethernet, and upcoming communications standards, e.g. the IEEE P802.3bs standard for 400 Gb/s Ethernet.

SUMMARY

According to at least one embodiment of the present invention there is provided a sequence detector for detecting symbol values corresponding to a sequence of input samples obtained from an ISI channel. The sequence detector comprises a branch metric unit (BMU) and a path metric unit (PMU). The BMU, which comprises an initial set of pipeline stages, is adapted to calculate, for each input sample, branch metrics for respective possible transitions between states of a trellis. To calculate these branch metrics, the BMU selects hypothesized input values, each dependent on a possible symbol value for the input sample and L>0 previous symbol values corresponding to possible transitions between states of the trellis. The BMU then calculates differences between the input sample and each hypothesized input value. The BMU compares these differences and selects, as the branch metric for each possible transition, an optimum difference in dependence on a predetermined state in a survivor path through the trellis. The PMU, which comprises a subsequent set of pipeline stages arranged to receive the branch metrics from the BMU, is adapted to calculate path metrics for respective survivor paths through the trellis by selecting said predetermined state in each survivor path in dependence on the branch metrics, and to feedback this predetermined state to the BMU.

At least one further embodiment of the invention provides a corresponding method for detecting symbol values corresponding to a sequence of input samples obtained from an ISI channel. At least one additional embodiment of the invention provides a computer program product comprising a computer readable storage medium embodying program instructions, executable by a processing device, to cause the processing device to perform the foregoing method.

Embodiments of the invention will be described in more detail below, by way of illustrative and non-limiting example, with reference to the accompanying drawings.

BRIEF DESCRIPTION OF THE SEVERAL VIEWS OF THE DRAWINGS

FIG. 1 is a schematic block diagram of a sequence detector according to one or more embodiments of the invention;

FIG. 2 illustrates a stream of termination blocks transmitted to the FIG. 1 detector via an ISI channel;

FIG. 3 indicates steps performed by a branch metric unit of the FIG. 1 detector;

FIG. 4 indicates steps performed by a path metric unit of the FIG. 1 detector;

DETAILED DESCRIPTION

Figure 5:
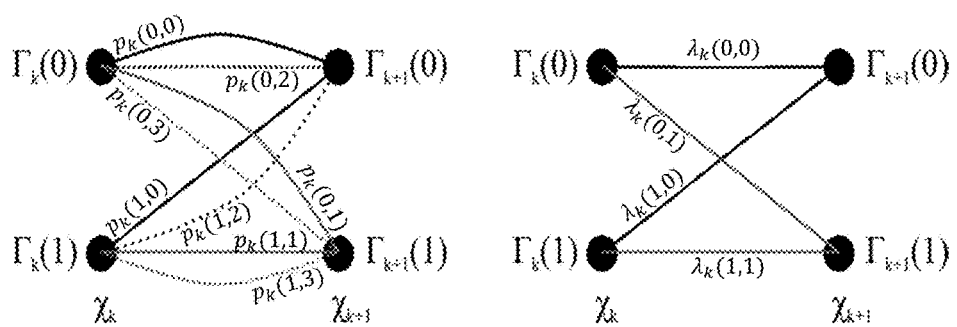
FIG. 5 shows trellis diagrams for a reduced-state trellis indicating both unresolved and resolved parallel transitions.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

FIG. 1 indicates structure of an exemplary sequence detector 1 embodying the invention. The sequence detector 1 comprises a branch metric unit (BMU) 2, a path metric unit (PMU) 3, and a survivor memory unit (SMU) 4. The units 2, 3, 4 of detector 1 comprise a series of pipeline stages. In particular, the BMU 2 comprises an initial set of pipeline stages, and the PMU 3 comprises a subsequent set of pipeline stages, where each set may in general comprise one or more stages. The BMU 2 receives a sequence of input samples obtained from an ISI channel. The input samples are obtained in known manner by sampling the channel output corresponding to a symbol sequence input to the channel. The input sample sequence is input, sample by sample, to the BMU. When all input samples corresponding to the symbol sequence to be detected have been processed by the detector, the SMU 4 outputs a sequence of symbols with symbol values that have been detected as the most probable values corresponding to the input symbol sequence. In this example, the sequence of input samples received by detector 1 corresponds to a "termination block" as defined by the IEEE P802.3bj standard. This standard defines a termination block as a block of symbols which starts with, and is followed by, a known "termination symbol" as depicted schematically in FIG. 2. The standard specifies transmitting termination symbols that enable simplified detector architectures because the termination symbol is known to the receiver. As described further below, a plurality of sequence detectors may operate in parallel to process successive termination blocks in the input stream. However, each sequence detector 1 operates to detect the symbol values corresponding to the sequence of samples for a given termination block.

An ISI channel has a discrete-time impulse response with L+1 channel coefficients where L>0. In particular, the channel is modelled by its discrete-time impulse-response sequence $h=(h_0, h_1, \ldots, h_L)$ where L is the number of interfering channel coefficients (channel memory). For a symbol $u_k$ input to the channel at time k, the corresponding channel output $y_k$ can be expressed as $y_k = \sum_{i=0}^{L} h_i u_{k-i}$ and is thus a function of $u_k$ and the L previous symbols $u_{k-1}$ to $u_{k-L}$. This output is corrupted by additive white Gaussian noise (AWGN) $w_k$, whereby the resulting input sample at sequence detector 1 is given by $z_k = y_k + w_k$.

The BMU 2 receives each input sample $z_k$ and also receives the channel coefficient vector $h=(h_0, h_1, \ldots, h_L)$ described above. For each input sample $z_k$, the BMU 2 calculates branch metrics $\lambda_k$ for respective possible transitions between states of a trellis. In particular, the coefficient vector h is used to produce hypothesized input values in a hypothesized value generator (HVG) of the BMU as explained below. The BMU 2 compares each input sample $z_k$ with the hypothesized input values and, using the outcomes of such comparisons, calculates the branch metrics (denoted by $\lambda_k$ in FIG. 1) and unresolved subset decisions (denoted by $\varsigma_k^I$ in FIG. 1) associated with these. The branch metrics are used in PMU 3 to make decisions (state decisions $\chi_{k-1}$ in FIG. 1) on states in respective survivor paths through the trellis. These survivor paths represent possible symbol sequences corresponding to the input samples processed thus far. The state decisions $\chi_{k-1}$ and corresponding branch metrics $\lambda_k$ are used to update path metrics for these survivor paths. The PMU 3 makes tentative symbol decisions ($\hat{u}_{k-1}$ in FIG. 1) corresponding to the states for each survivor path. The state decisions $\chi_{k-1}$ and tentative symbol decisions $\hat{u}_{k-1}$ are supplied to the SMU 4 which stores the symbol decisions for the survivor paths. The survivor paths are thus updated in each time step. At the end of the input sequence, a reset/end of termination block signal "$reset_k$" is transmitted by a synchronizer to the PMU 3 to reset the path metrics at the end of the termination block. This reset signal is also supplied to the SMU 4 which selects, based on the known state $\chi_{k,term}$ corresponding to the termination symbol, the survivor sequence from the survivor paths, and outputs the symbol sequence thus detected.

Note that, as indicated in FIG. 1, the state decisions $\chi_{k-1}$ (and resolved subset decisions $\varsigma_{k-1}^I$) are fed back by the PMU 3 to the BMU 2. The BMU calculates the branch metrics in the initial set of pipeline stages, and the PMU makes state decisions, and calculates the path metrics, in a subsequent set of pipeline stages. Thus, while the BMU calculates branch metrics for a given input sample, the PMU makes state decisions for a previous input sample. In the embodiments detailed below, the PMU makes state decisions, and calculates the path metrics, in the next pipeline stage after the BMU. Hence, the branch metrics $\lambda_k$ for a given input sample $z_k$ are generated in the BMU in the same time step k as that in which the PMU makes state decisions $\chi_{k-1}$ for the preceding sample $z_{k-1}$. FIGS. 3 and 4 indicate steps performed by the BMU 2 and PMU 3 respectively in the pipelined operation of detector 1. (Note that steps of these figures do not correspond to time steps k of the pipelined operation. As indicated above, the BMU operation of FIG. 3 is performed over one or more time steps k. The PMU operation of FIG. 4 is performed in a single time step in the embodiments below.)

Considering first the BMU operation in FIG. 3, an input sample $z_k$ is received by the BMU in step 30. In step 31, the BMU selects hypothesized input values, denoted by $z_k^h$, from values provided by the HVG as detailed below. Each hypothesized input value $z_k^h$ is dependent on a possible symbol value for the input sample $z_k$ and L previous symbol values corresponding to possible transitions between states of the trellis. In step 32, the BMU calculates differences $d_k$ between the input sample $z_k$ and each hypothesized input value $z_k^h$. (Various difference measures may be used here as discussed further below). In step 33, the BMU compares these differences $d_k$ and selects, as the branch metric $\lambda_k$ for each possible transition, an optimum difference in dependence on a predetermined state in a survivor path through the trellis. This predetermined state is the state $\chi_{k-1}$ as determined by the PMU for the previous input sample $z_{k-1}$. In step 34, the branch metrics $\lambda_k$ are output to the PMU, together with unresolved subset decisions $\varsigma_k^I$ associated with the branch metrics. Due to the pipelining, the PMU will process the branch metrics $\lambda_k$ in the next time step of the pipelined operation. Hence, in the time step in which the branch metrics $\lambda_k$ are output by the BMU, the PMU receives the branch metrics $\lambda_{k-1}$, and unresolved subset decisions $\varsigma_{k-1}^I$, for the preceding input sample $z_{k-1}$ as indicated at step 40 of FIG. 4. The branch metrics $\lambda_{k-1}$ are used by the PMU to calculate path metrics (denoted by $\Gamma_k$) for respective survivor paths through the trellis. In particular, in step 41 the PMU selects the state $\chi_{k-1}$ in each survivor path in dependence on the branch metrics $\lambda_{k-1}$. As explained in more detail below, this step involves an addition operation using the path metrics $\Gamma_{k-1}$ calculated thus far. The selected state $\chi_{k-1}$ for each survivor path is fed back to the BMU in step 42, and thus provides the predetermined state used by the BMU in step 33 of FIG. 3. In step 43, the PMU updates the previous path metric $\Gamma_{k-1}$ to $\Gamma_k$ for each survivor path using the branch metric $\lambda_{k-1}$ corresponding to the predetermined state $\chi_{k-1}$. In step 44, the PMU selects a latest symbol value (tentative symbol decision $\hat{u}_{k-1}$) in each survivor path from the unresolved subset decisions $\varsigma_{k-1}^I$ based on the predetermined state $\chi_{k-1}$. In step 45, the tentative symbol decision $\hat{u}_{k-1}$ and state decision $\chi_{k-1}$ for each survivor path are output to the SMU 4.

It will be seen from the above that the sequence detector 1 performs branch metric calculations and the corresponding path metric calculations in different clock periods corresponding to different pipeline stages, and the predetermined state $\chi_{k-1}$ is fed back by the PMU for use in selecting the branch metrics $\lambda_k$ (step 33) in the BMU earlier in the pipeline. In this way, the step of calculating the distance between the hypothesized input values and the input sample in the BMU, which involves at least one addition, is separated from calculating the path metrics in the PMU, in particular from the addition operation needed for updating the path metrics. The number of addition operations on the longest path of the detector is therefore reduced to one. This offers a significant increase in data rates achievable with the sequence detector.

Embodiments of detector 1 illustrating the foregoing point will be described in more detail below. The various components of the implementations below can be implemented by hard-wired logic circuits of generally known form. In general, however, the detector functionality can be implemented in hardware or software or a combination thereof.

In a first embodiment of sequence detector 1, the detector is a reduced-state sequence detector (RSSD) whereby the BMU 2 is adapted to calculate the branch metrics) $\lambda_k$ for transitions between states (referred to below as "substates") of a reduced-state trellis. The reduced-state trellis is constructed via mapping by set partitioning. The reduced-state subset trellis for this embodiment is shown in FIG. 5 for both unresolved parallel transitions (left) and resolved transitions (right). The symbols $u_k$ transmitted over the channel in this embodiment are four-level pulse-amplitude modulation (4-PAM) symbols selected from a signal constellation $\mathbb{A} = \{-3, -1, +1, +3\}$ in accordance with the IEEE P802.3bj standard. These symbols are allocated to subsets $\varsigma \in \{\{-3, +1\}, \{-1, +3\}\}$. The reduced-state trellis has two substates $\chi=0$ and $\chi=1$. The subset to which the symbol $u_k$ belongs determines the substate $\chi_{k+1}$ at time k+1 according to: $\chi_{k+1}=0$ if $u_k \in \{-3, +1\}$ and $\chi_{k+1}=1$ if $u_k \in \{-1, +3\}$. At any time k there are two survivor paths, one ending in substate $\chi_k=0$ and the other ending in substate $\chi_k=1$, with path metrics $\Gamma_k(0)$ and $\Gamma_k(1)$, respectively. The branch metrics $p_k(\chi_k, u_k^i)$ corresponding to respective parallel transitions from substate $\chi_k$ when $u_k$ is transmitted (where $u_k^i$ is the index of $u_k$ in $\mathbb{A}$, $i \in \mathbb{Z}$ and $0 \leq i \leq 3$) are indicated in the left-hand diagram of FIG. 5. The branch metrics $\lambda_k(\chi_k, \chi_{k+1})$ corresponding to the resolved transitions of the reduced-state trellis are shown in the right-hand diagram.

In this embodiment, the RSSD 1 implements the Viterbi algorithm with two post-cursor per-survivor decision-feedback taps $\{h_1, h_2\}$, i.e. L=2. The Viterbi algorithm finds the most probable input sequence, given a sequence of observations of a discrete-time finite-state Markov process in memoryless noise. This rule minimizes the error probability in detecting the whole sequence and hence is optimum in that sense. The HVG in the BMU 2 constructs the hypothesized input values $z_k^h$ by taking the inner product of the symbols $\hat{u}_{k-1}, \hat{u}_{k-2}$ in each survivor path with the post-cursor discrete-time channel impulse-response sequence $\{h_1, h_2\}$ and adding $h_0 u_k$ to the result:

$$z_k^h = u_k + h_1 \hat{u}_{k-1} + h_2 \hat{u}_{k-2} \; \forall u_k \in \mathbb{A}$$

Where we assume, without loss of generality, that the main-cursor tap $h_0=1$.

The BMU 2 of the RSSD 1 comprises four component units for calculating the branch metrics $\lambda_k(0,0)$, $\lambda_k(0,1)$, $\lambda_k(1,0)$, $\lambda_k(1,1)$ respectively for the four possible transitions in the resolved transition trellis diagram of FIG. 5. In addition, we assume here that eight parallel RSSDs 1 are used to process the stream of transmitted termination blocks (FIG. 2) in an implementation clocked at one-eighth of the full clock rate (as determined by the modulation interval). The termination block contains 48 symbols of 2 bits each to represent the four possible 4-PAM symbol values. The notation used in describing this embodiment is set out below.

$\mathbb{A}$: 4-PAM signal constellation $\mathbb{A}=\{-3, -1, +1, +3\}$;
$u_k$: transmitted 4-PAM symbol at time k, $u_k \in \mathbb{A}$;
$u_k^i$: index of $u_k$ in $\mathbb{A}$, $i \in \mathbb{Z}$ and $0 \leq i \leq 3$, $u_k = \mathbb{A}(u_k^i)$;
$\hat{u}_k$: tentative symbol decision;
h: discrete-time channel impulse-response sequence;
$z_k$: received input symbol at time k;
$\varsigma_k$: subset to which $u_k$ belongs; $\varsigma_k \in \{\{-3, +1\}, \{-1, +3\}\}$;
$\varsigma_k^I$: resolved subset decision prior to inverse mapping; index of $\hat{u}_k$ in $\varsigma_k$, $I \in \mathbb{Z}$ and $0 \leq I \leq 1$; $\hat{u}_k = \varsigma_k(\varsigma_k^I)$;
$\chi_k$: subset at time k; $\chi_k = \varsigma_{k-1}$; $\chi_k=0$ if $\varsigma_{k-1} \in \{-3, +1\}$ and $\chi_k=1$ if $\varsigma_{k-1} \in \{-1, +3\}$;
$^1\chi_k$: $\chi_k$ on the survivor sequence of $\chi_{k+1}=i$, where $i \in \mathbb{Z}$ and $0 \leq i \leq 1$;
$^i\hat{u}_k$: $\hat{u}_k$ corresponding to $\chi_{k+1}=i$, where $i \in \mathbb{Z}$ and $0 \leq i \leq 1$; $^0\hat{u}_k \in \{-3, +1\}$, and $^1\hat{u}_k \in \{-1, +3\}$;
$^i\varsigma_k^I$: $\varsigma_k^I$ corresponding to $\chi_{k+1}=i$, where $i \in \mathbb{Z}$ and $0 \leq i \leq 1$;
$\varsigma_k^I(\chi_k, \chi_{k+1})$: unresolved subset decision prior to inverse mapping determined by the resolved parallel transition from $\chi_k$ to $\chi_{k+1}$;
$z_k^h(\hat{u}_{k-1}^i, u_k^i)$: hypothesized input value for the case when $u_k$ is transmitted with the symbol decision history $\hat{u}_{k-1}^i$;
$d_k(\hat{u}_{k-1}^i, u_k^i)$: Euclidean distance between $z_k$ and $z^h(\hat{u}_{k-1}^i, u_k^i)$;
$p_k(\chi_k, u_k^i)$: branch metric corresponding to one of the parallel transitions originating from substate $\chi_k$ when $u_k$ is transmitted;
$\lambda_k(\chi_k, \chi_{k+1})$: branch metric corresponding to the transition from substate $\chi_k$ to $\chi_{k+1}$;
$\Gamma_k(\chi_k, \chi_{k+1})$: partial path metric corresponding to the transition from substate $\chi_k$ to $\chi_{k+1}$;
$\Gamma_k(\chi_k)$: path metric of the substate $\chi_k$;
$\chi_{k,term}$: termination substate;
$c_8$: eighth-rate clock signal.

The four component BMU units of BMU 2 are shown in FIGS. 7a through 7d. The component BMUs calculate the branch metrics that are weights of trellis transitions indicating the likelihood of a certain transition in time. In this implementation, a larger branch metric means a less likely transition. As indicated in the figures, the HVG in each component BMU is implemented as a register array providing the hypothesized input values $z_k^h(\hat{u}_{k-1}^i, u_k^i)$, where $\hat{u}_{k-1}^i = \{\hat{u}_{k-1}^i, \hat{u}_{k-2}^i, \dots\}$, with which the input sample $z_k$ is compared. The hypothesized input values $z_k^h(\hat{u}_{k-1}^i, u_k^i)$ are what the input sample $z_k$ would be for a certain permutation of transmitted input symbols $\{u_k, u_{k-1}, u_{k-2}\}$ in the absence of noise.

Figure 6:
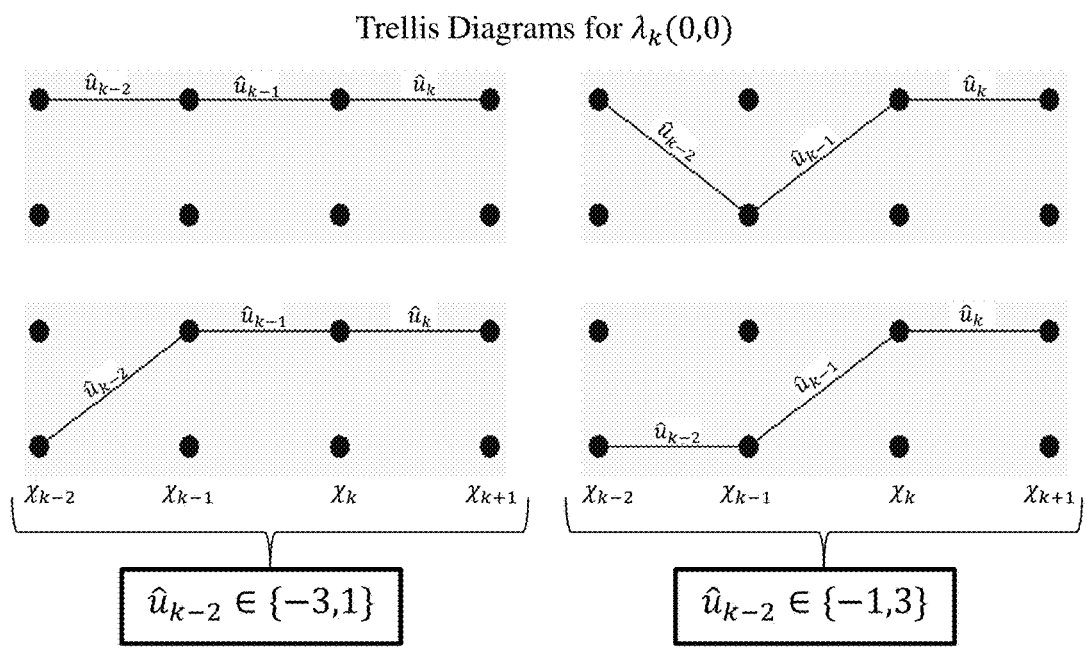
FIG. 6 shows trellis diagrams for use in calculating a branch metric in a branch metric unit of a first embodiment.
Figure 7A:
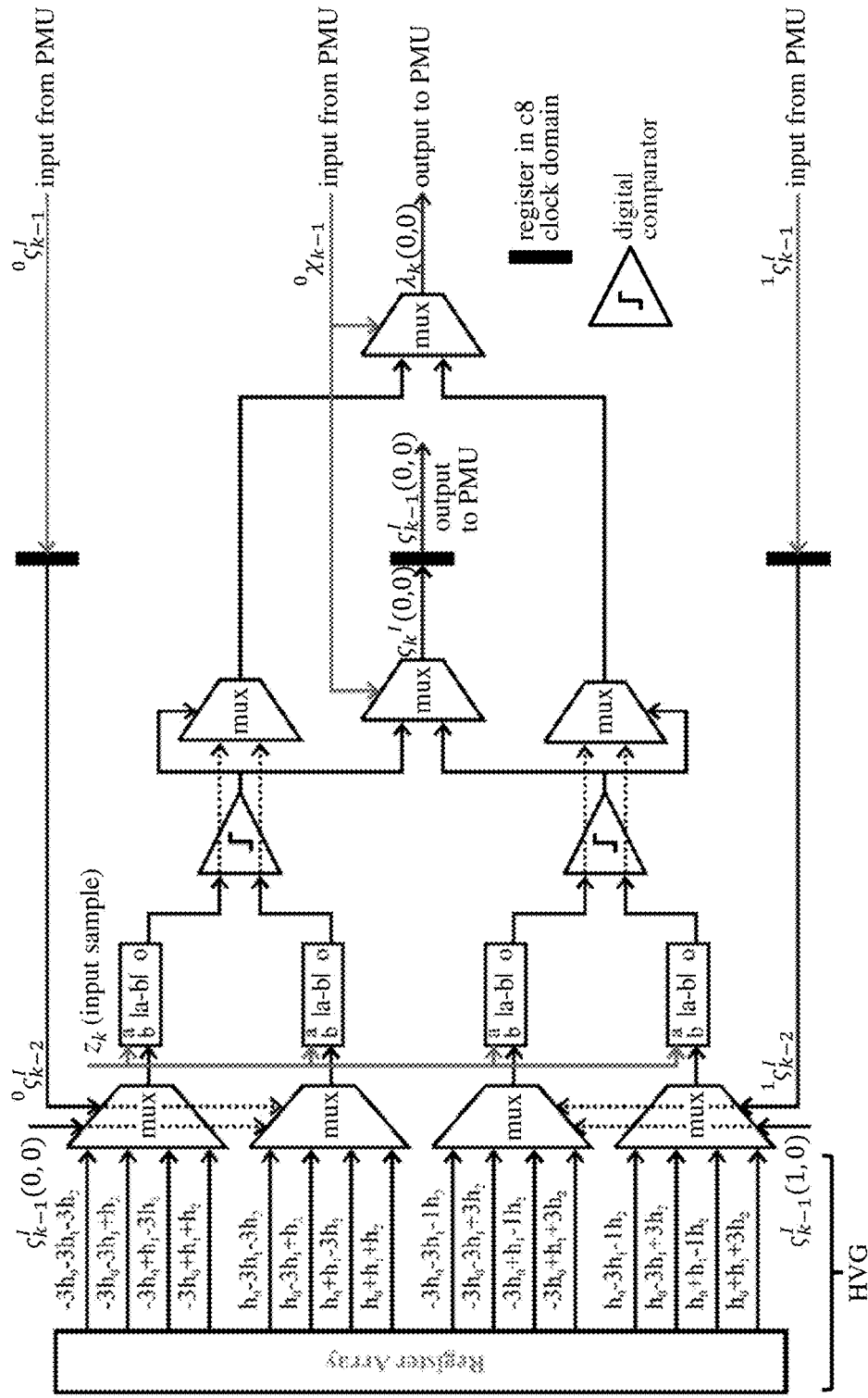
FIG. 7a is a schematic block diagram of components of a branch metric unit according to one or more embodiments.

The operation of the component BMUs can be understood by considering the operation of the component BMU for calculating $\lambda_k(0, 0)$ in FIG. 7a. For the $\chi_k=0$ to $\chi_{k+1}=0$ transition, all possible trellis transitions for $\{u_k, u_{k-1}, u_{k-2}\}$ are shown in FIG. 6. Since $\chi_k=0$ and $\chi_{k+1}=0$, $\hat{u}_{k-1} \in \{-3, +1\}$ and $\hat{u}_k \in \{-3, +1\}$. For the two trellis diagrams on the left $\hat{u}_{k-2} \in \{-3, +1\}$, and for the two trellis diagrams on the right $\hat{u}_{k-2} \in \{-1, +3\}$. Therefore, $\varsigma_{k-2}^I$ can be used to choose the contribution of $\hat{u}_{k-2}$ to $z_k^h(\hat{u}_{k-1}^i, u_k^i)$, and $\varsigma_{k-1}^I(0, 0)$ and $\varsigma_{k-1}^I(1, 0)$ can be used to choose the contribution of $\hat{u}_{k-1}$ to $z_k^h(\hat{u}_{k-1}^i, u_k^i)$. Pipelining results in one clock period of latency. A first bank of multiplexers (mux) in FIG. 7a receive the outputs of the HVG register array corresponding to the possible transitions of FIG. 6 and hence the possible permutations of symbol values for $u_k, u_{k-1}, u_{k-2}$. These multiplexers select the four appropriate values $z_k^h(\hat{u}_{k-1}^i, u_k^i)$ based on inputs $\varsigma_{k-1}^I(0, 0)$ or $\varsigma_{k-1}^I(1, 0)$, and $^0\varsigma_{k-2}^I$ or $^1\varsigma_{k-2}^I$, for $u_{k-1}$ and $u_{k-2}$. The inputs $^0\varsigma_{k-2}^I$ and $^1\varsigma_{k-2}^I$ are fed back from the PMU 3 for $z_{k-1}$ and delayed one clock period by the $c_8$ registers in the top and bottom input lines in the figure. The input $\varsigma_{k-1}^I(0, 0)$ is fed back from the BMU output, delayed one clock period by the $c_8$ register in the center of the figure. (The input $\varsigma_{k-1}^I(1, 0)$ is fed back from the corresponding BMU output of FIG. 7c). The four hypothesized values $z_k^h(\hat{u}_{k-1}^i, u_k^i)$, thus selected are supplied to respective difference calculators (|a−b|), each of which receives the current input sample $z_k$.

The squared Euclidean distance is the optimum branch metric for an ideal AWGN channel. However, to reduce hardware complexity and based on simulation results indicating negligible loss in performance, the Euclidean distances $d_k(\hat{u}_{k-1}^i, u_k^i)$ are used here as the difference measure to calculate the branch metrics $p_k(\chi_k, u_k^i)$:

$$d_k(\hat{u}_{k-1}{}^i, u_k{}^i) = |z_k - z_k{}^h(\hat{u}_{k-1}{}^i, u_k{}^i)|, \forall u_{k-1}, u_k \in \mathbb{A};$$

$$p_k(\chi_k, u_k{}^i) = d_k(\hat{u}_{k-1}{}^i, u_k{}^i), \forall u_k \in \mathbb{A}, \forall u_{k-1} \in \varsigma_{k-1} \text{ and } \chi_k = \varsigma_{k-1}.$$

Paired outputs of the difference calculators are compared by the digital comparators and the smallest of each pair is selected by the upper and lower multiplexers in the second multiplexer bank the figure. The central multiplexer in this bank selects the unresolved subset decision $\varsigma_k{}^I(0, 0)$ based on the predetermined state $^0\chi_{k-1}$ in the survivor path ending in $\chi_k = 0$ which is fed back from the PMU 3 as described above. $\varsigma_k{}^I(0, 0)$ is the unresolved subset decision prior to inverse mapping determined by a resolved parallel transition indicating which parallel transitions have survived. This unresolved subset decision $\varsigma_k{}^I(0, 0)$ is delayed one clock period by the $c_8$ register at the multiplexer output, and supplied to the PMU as $\varsigma_{k-1}{}^I(0, 0)$ in the next clock period. This delayed decision $\varsigma_{k-1}{}^I(0, 0)$ is also fed back to the initial BMU multiplexer bank as described above. The predetermined state $^0\chi_{k-1}$ is also used to select the final branch metric $\lambda_k(0, 0)$ in the final multiplexer of the figure. The resulting $\lambda_k(0, 0)$ thus represents the optimum (here smallest) difference.

Figure 7B:
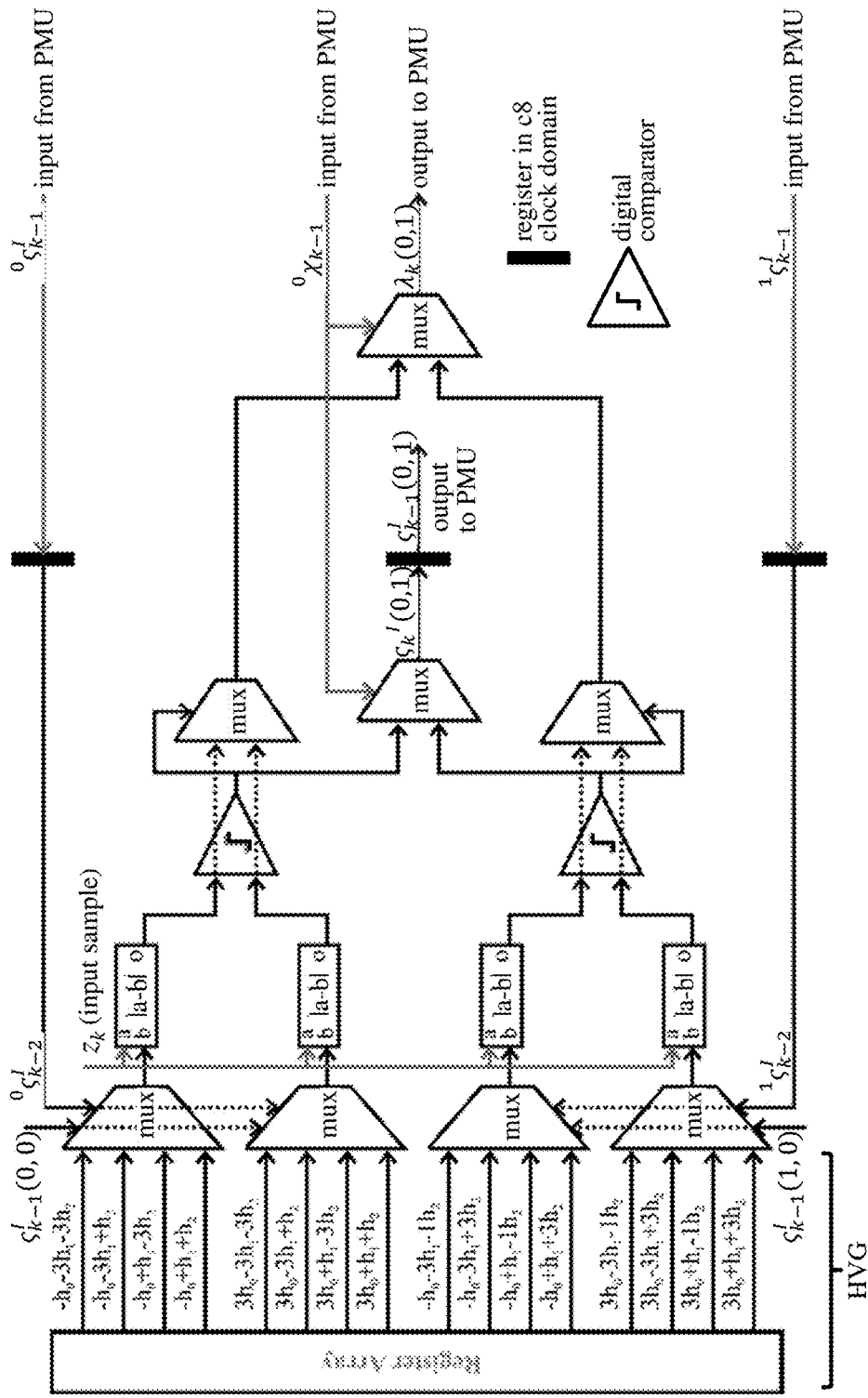
FIG. 7b is a schematic block diagram of components of a branch metric unit according to one or more embodiments.
Figure 7C:
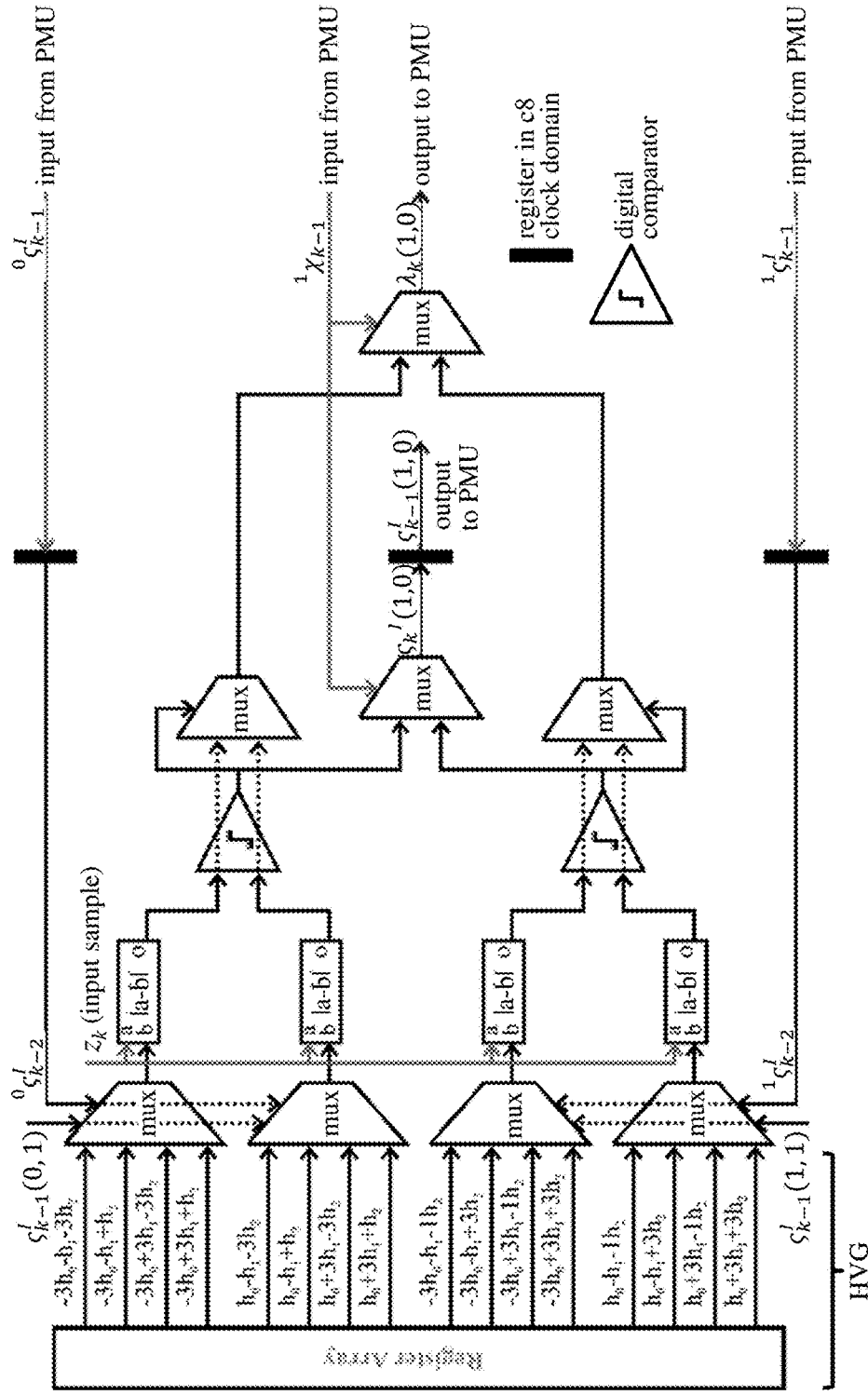
FIG. 7c is a schematic block diagram of components of a branch metric unit according to one or more embodiments.
Figure 7D:
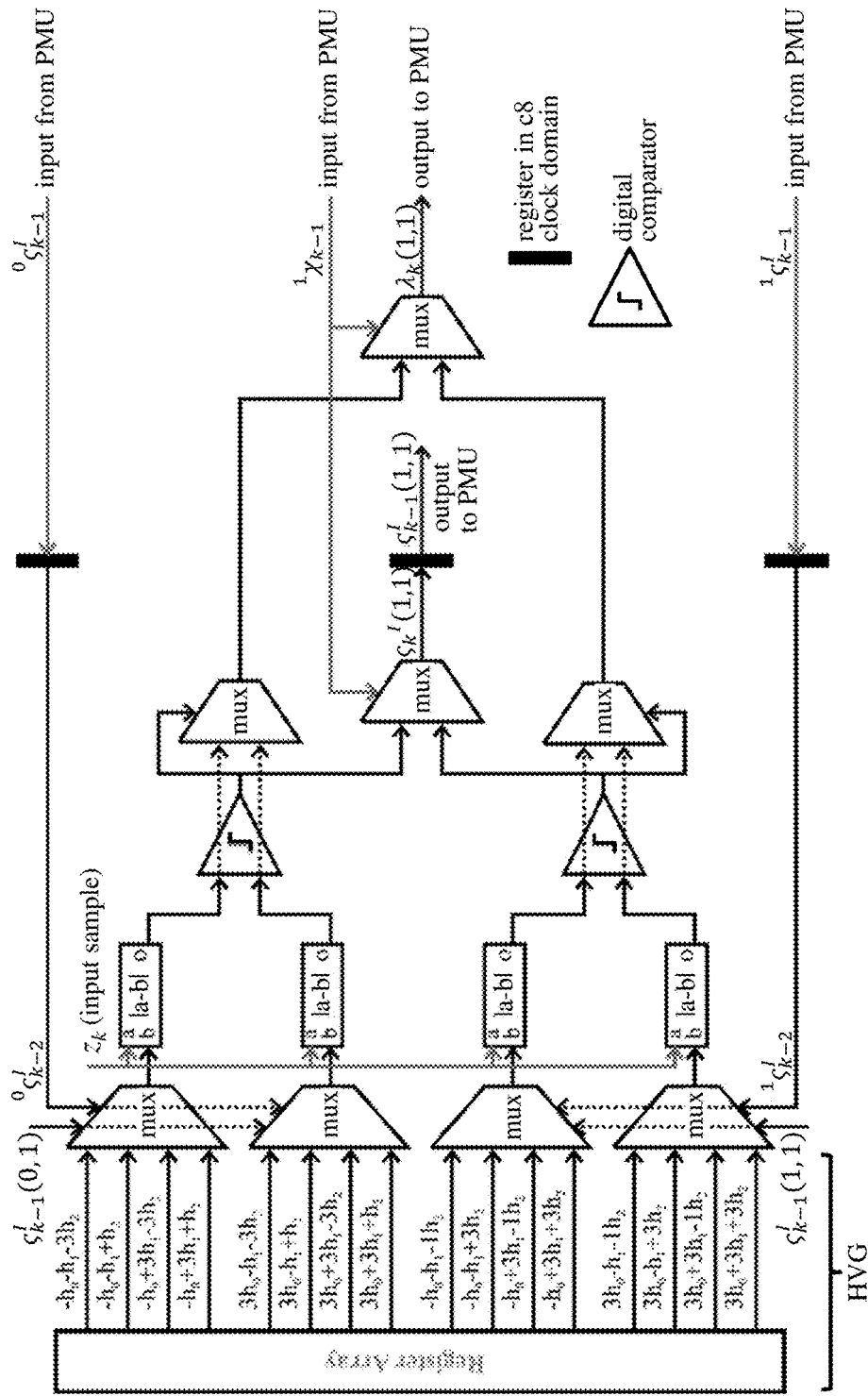
FIG. 7d is a schematic block diagram of components of a branch metric unit according to one or more embodiments.

The appropriate inputs for the equivalent operation of the component BMUs for $\lambda_k(0, 1)$, $\lambda_k(1, 0)$ and $\lambda_k(1, 1)$ are shown in FIGS. 7b through 7d. After the parallel transitions are resolved, the branch metrics $\lambda_k(\chi_k, \chi_{k+1})$ in the trellis diagram with 2 substates are thus $$\lambda_k(\chi_k, \chi_{k+1}) = \min_{u_k \in \varsigma_k} p_k(\chi_k, u_k^j).$$

Figure 8:
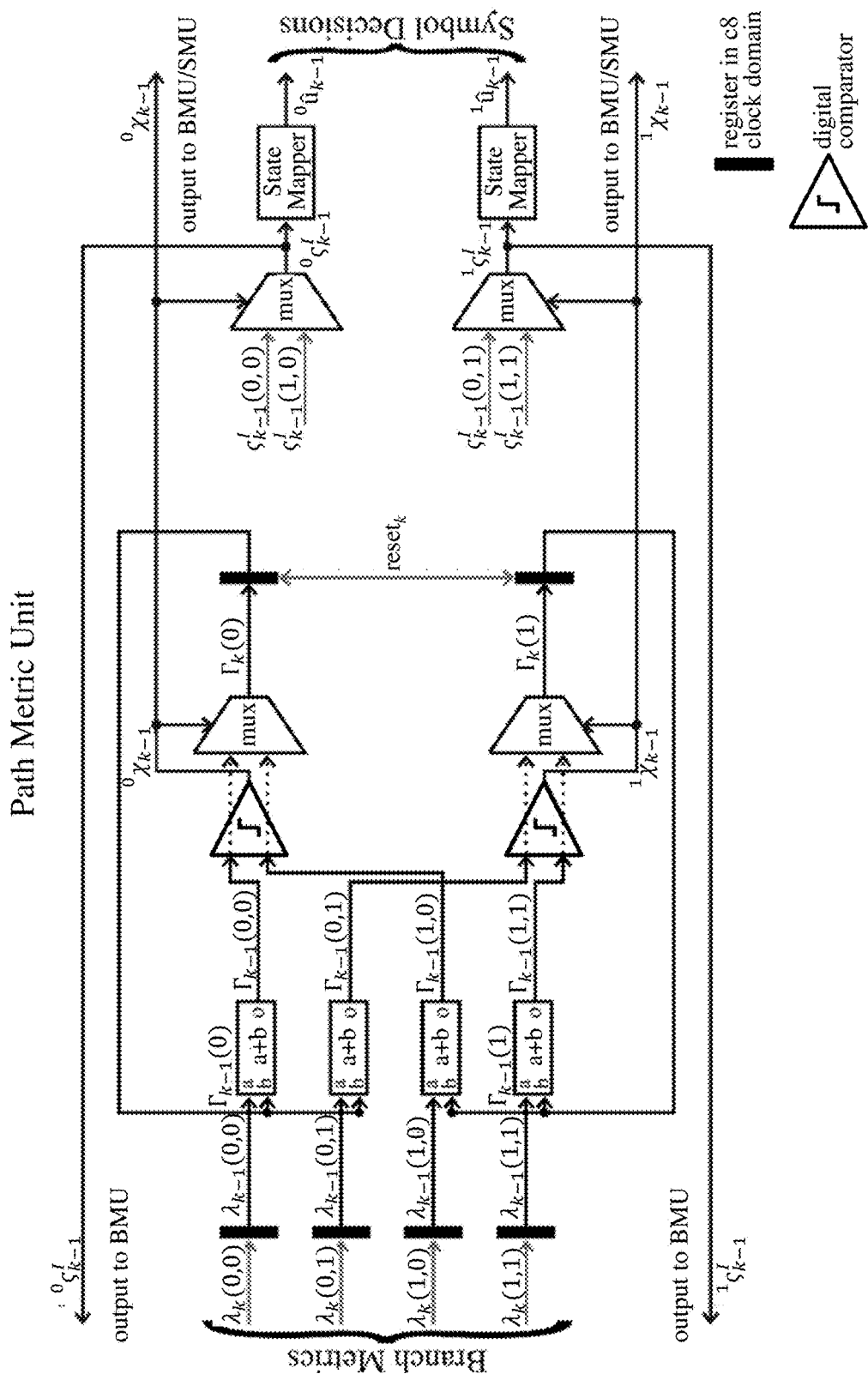
FIG. 8 is a schematic block diagram of a path metric unit according to one or more embodiments.

It can be seen that the BMU 2 here comprises one initial pipeline stage, resulting in one clock period of latency. The PMU 3 is adapted to calculate the path metrics corresponding to $z_k$ in the next pipeline stage. The PMU 3 shown in FIG. 8 computes the path metrics $\Gamma_k$ for the two survivor paths through the trellis by making substate decisions $^0\chi_{k-1}$ and $^1\chi_{k-1}$, and makes tentative symbol decisions $^0\hat{u}_{k-1}$ and $^1\hat{u}_{k-1}$ to select the latest symbol value in each survivor path. In particular, the branch metrics $\lambda_k(\chi_k, \chi_{k+1})$ from the BMU 2 are delayed by respective $c_8$ registers at the PMU input, so the PMU processes the branch metrics $\lambda_{k-1}(\chi_{k-1}, \chi_k)$ for $z_{k-1}$ while the BMU processes $z_k$. The branch metrics $\lambda_{k-1}(\chi_{k-1}, \chi_k)$ are supplied to respective adders (a+b) which also receive the previous path metrics $\Gamma_{k-1}(0)$ or $\Gamma_{k-1}(1)$, i.e. the path metrics thus far for the two survivor paths. The adders output respective partial path metrics:

$$\Gamma_{k-1}(\chi_{k-1}, \chi_k) = \Gamma_{k-1}(\chi_{k-1}) + \lambda_{k-1}(\chi_{k-1}, \chi_k)$$

The partial path metrics are supplied in pairs to the digital comparators, and the smallest of each pair determines the substate $^0\chi_{k-1}$ or $^1\chi_{k-1}$ in the corresponding survivor path:

$$\chi_{k-1} = \operatorname*{argmin}_{\chi_{k-1}} \Gamma_{k-1}(\chi_{k-1}, \chi_k).$$

The selected substate $^0\chi_{k-1}$, $^1\chi_{k-1}$ is used to update the corresponding path metric by selection of the smallest $\Gamma_{k-1}(\chi_{k-1}, \chi_k)$ of each pair in the first bank of multiplexers:

$$\Gamma_k(\chi_k) = \min_{\chi_{k-1}} \Gamma_{k-1}(\chi_{k-1}, \chi_k).$$

The resulting path metrics $\Gamma_k(\chi_k)$ are output to the $c_8$ registers and fed back to the adders in the next clock period. These registers receive the reset signal $reset_k$ to reset the path metrics at the end of the input sequence.

The delayed unresolved subset decisions $\varsigma_{k-1}{}^I(\chi_{k-1}, \chi_k)$ from the BMU are applied in pairs to the second bank of multiplexers. The substate decisions $^0\chi_{k-1}$ and $^1\chi_{k-1}$ for the survivor paths are used to select the resolved subset decisions in each path as:

$$\varsigma_{k-1}^I = \operatorname*{argmin}_{\chi_{k-1}, u_{k-1} \in \varsigma_{k-1}} p_{k-1}(\chi_{k-1}, u_{k-1}^j).$$

These are then mapped to tentative symbol decisions $^i\hat{u}_{k-1}$ in the state mappers: $\hat{u}_{k-1} = \varsigma_{k-1}(\varsigma_{k-1}{}^I)$. We assume Gray coding for symbol mapping here in compliance with the IEEE P802.3bj standard.

Figure 9:
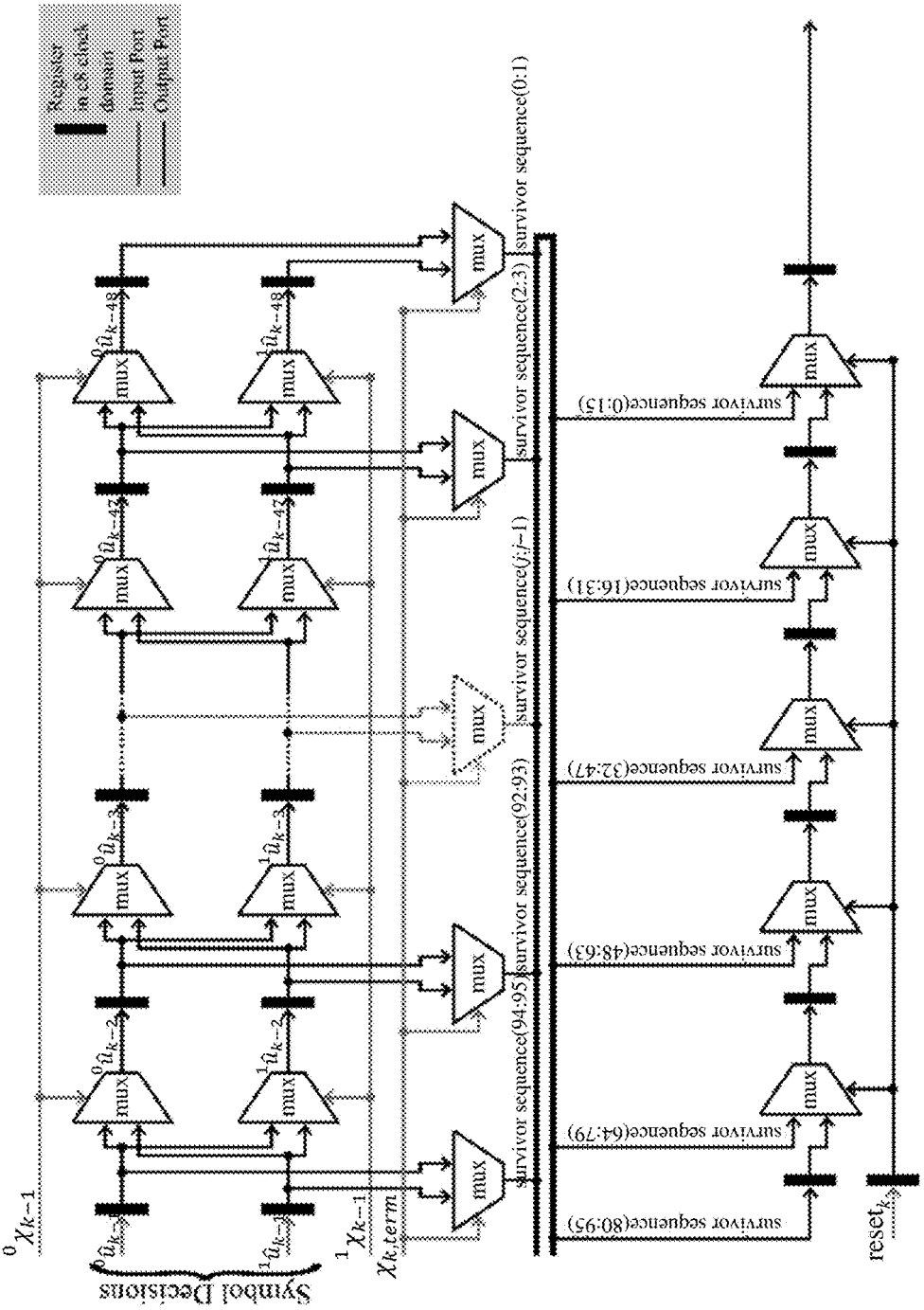
FIG. 9 is a schematic block diagram of a survivor memory unit according to one or more embodiments.

The substate decisions $^i\chi_{k-1}$ and resolved subset decisions $\varsigma_{k-1}{}^I$ are fed back to the BMU as described above. The tentative symbol decisions $^i\hat{u}_{k-1}$ and substate decisions $^i\chi_{k-1}$ are output to the SMU 4 shown in FIG. 9. The SMU of this example comprises a register exchange unit for storing the latest symbol value (tentative symbol decision $^0\hat{u}_{k-1}$ or $^0\hat{u}_{k-1}$) in each survivor path. The substate decisions $^i\chi_{k-1}$ are used as the select signals for the multiplexers in this unit in order to update the survivor paths in each clock period. The reset signal $reset_k$ supplied to this unit indicates when the last symbol of the termination block has been processed. The termination substate $\chi_{k,term}$ determines which of the two survivor paths succeeds as the survivor sequence according to the known substate of the termination symbol. In this embodiment, the bank of multiplexers at the bottom of FIG. 9 serve to output the symbol values in the selected survivor path in units of 16 bits to match data rates for possible subsequent processing units. However, this multiplexer bank could be omitted to output the bit pairs (0:1) to (94:95) defining symbols of the survivor sequence in a single clock cycle if desired.

It will be seen from the above operation that the pipeline register stage at the input to the PMU makes the branch metrics $\lambda_{k-1}(\chi_{k-1}, \chi_k)$ available at the active edge of the clock signal, and the resulting substate decisions $^i\chi_{k-1}$ are fed back to the BMU for selection of the path metrics $\lambda_k(\chi_k, \chi_{k+1})$ in the final multiplexer stage of the BMU. The substate decisions $^i\chi_{k-1}$ do not propagate through the difference calculators in the BMU. Hence, the step of Euclidean distance calculation in the BMU is separated from the addition operation in the adders of the PMU, the most time-consuming operation therein. These operations do not therefore contribute collectively to the longest path of the Viterbi detector, e.g. in terms of the propagation delay of the logic in a VLSI (very-large scale integration) realization. The number of addition operations on the longest path is reduced to one, significantly shortening this path. This technique breaks the bottleneck in metric calculations of sequence detectors, resulting in a significant increase in data rates achievable with a single sequence detector.

The size of the HVG register array holding the hypothesized input values is multiplied by the cardinality of the signal constellation, which is four for 4-PAM, for each per-survivor decision-feedback tap embedded in the design. This makes it prohibitive to use such register arrays for a large number of per-survivor decision-feedback taps.

A second embodiment of sequence detector 1 will now be described with reference to FIGS. 10 through 13. This embodiment provides an RSSD implementing the Viterbi algorithm with two substates $\chi=0$, $\chi=1$ as before, but for an arbitrary number of embedded per-survivor decision-feedback taps. For the sake of simplicity, three post-cursor per-survivor decision-feedback taps are shown. However, the structure and operation described can be readily extended to an arbitrary number of embedded per-survivor decision-feedback taps as will be apparent to those skilled in the art.

Figure 11:
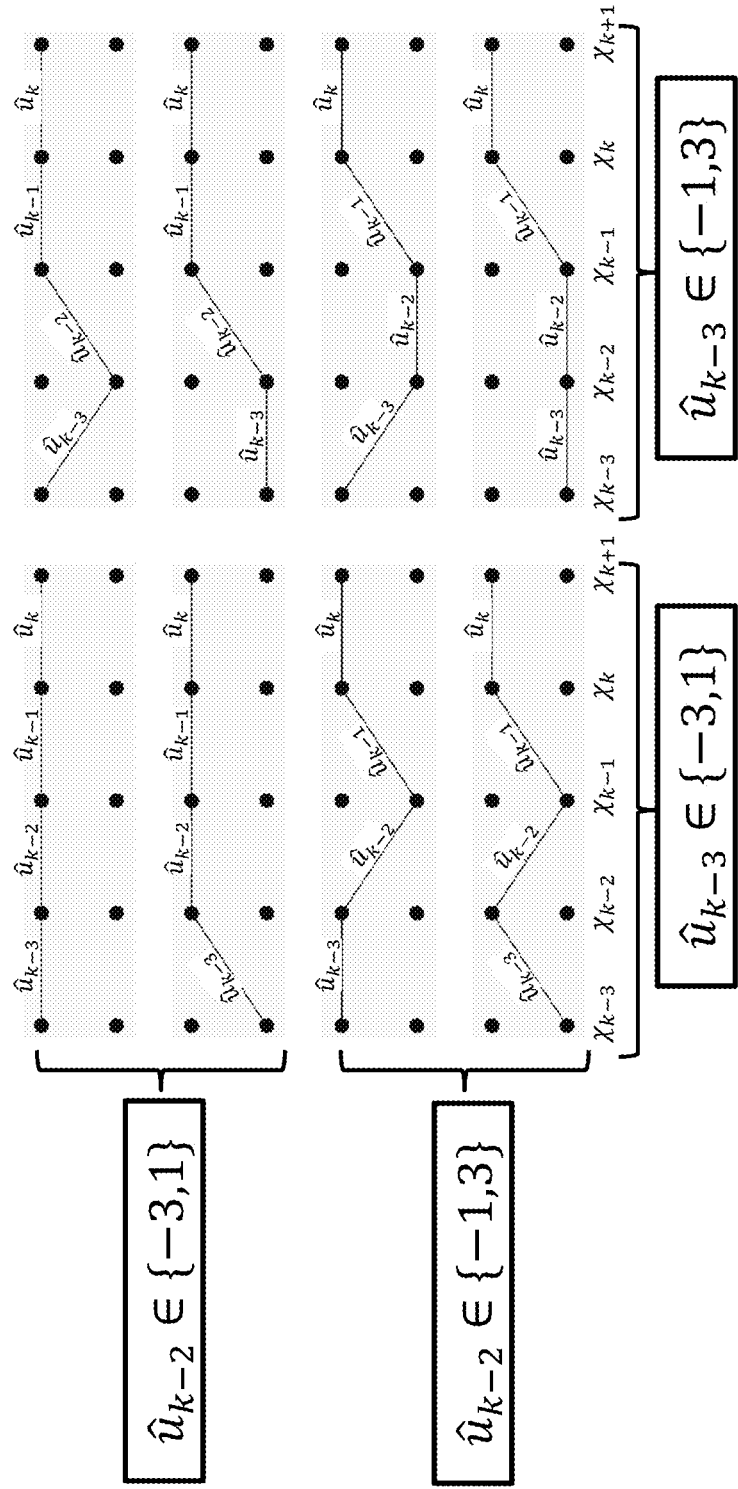
FIG. 11 shows trellis diagrams for use in calculating a branch metric in the branch metric unit of FIG. 10.
Figure 12:
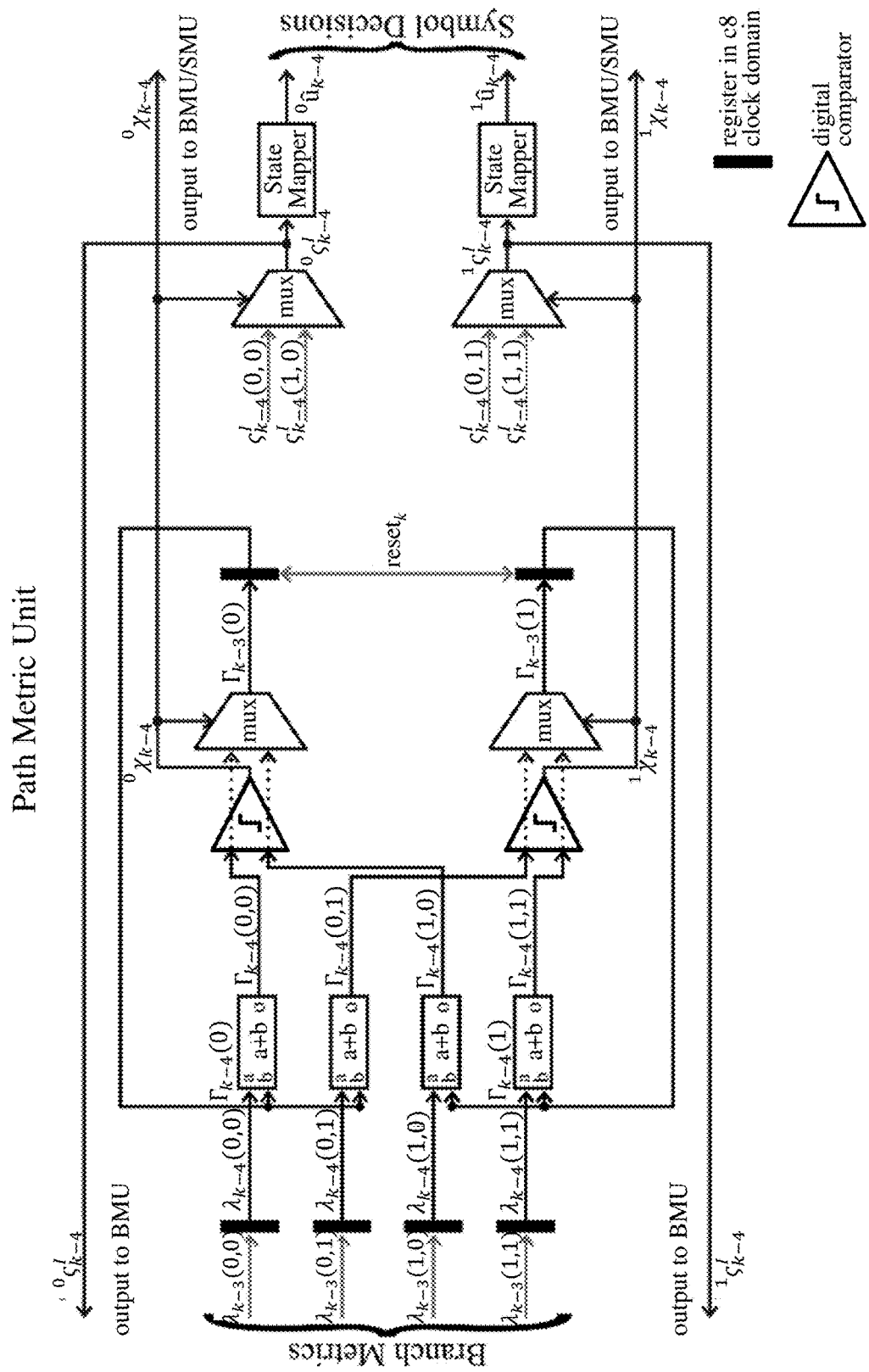
FIG. 12 is a schematic block diagram of a path metric unit according to one or more embodiments.
Figure 13:
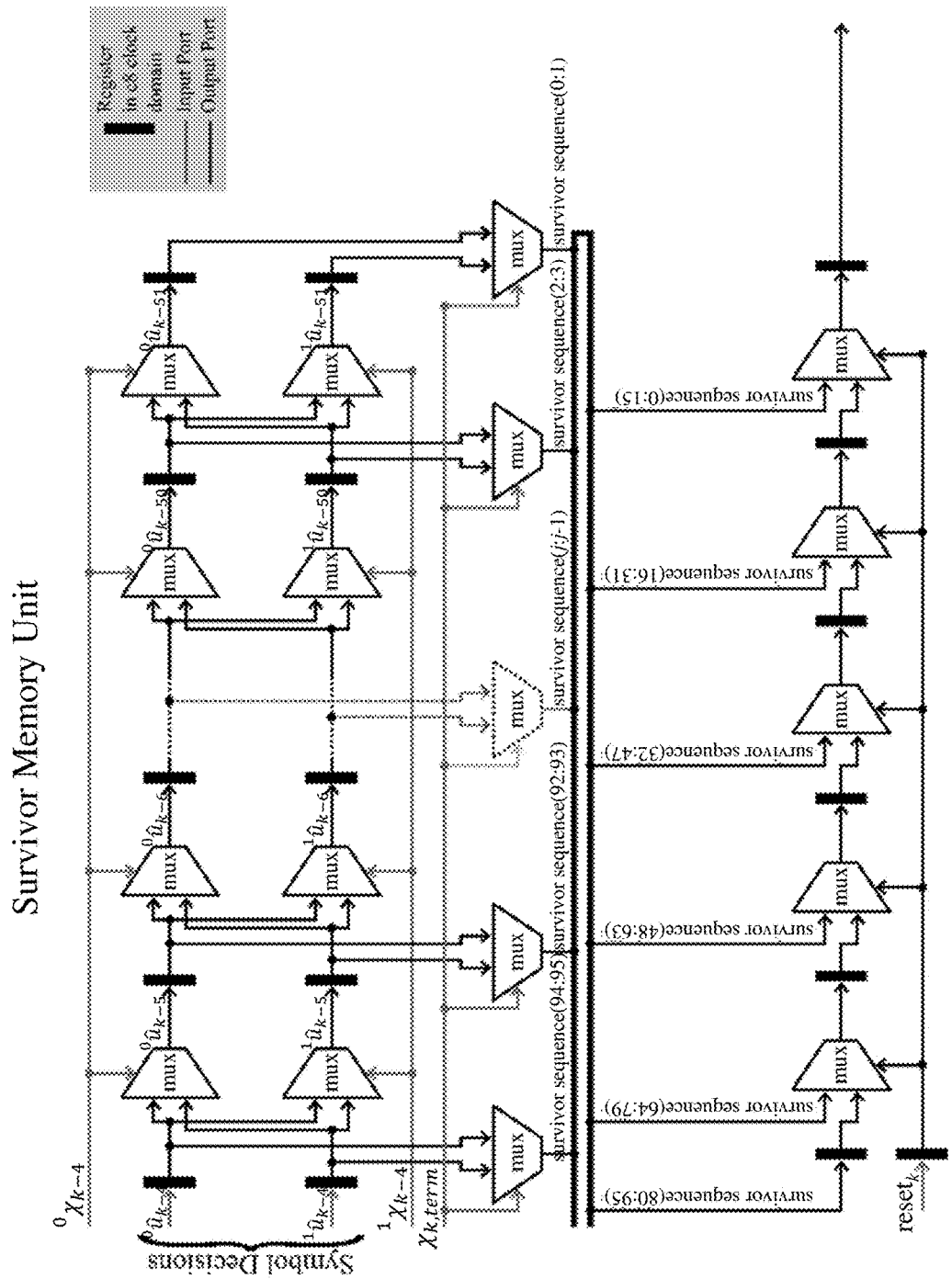
FIG. 13 is a schematic block diagram of a survivor memory unit according to one or more embodiments.

The BMU 2 of the RSSD 1 comprises four component units for calculating the branch metrics $\lambda_k(0, 0)$, $\lambda_k(0, 1)$, $\lambda_k(1, 0)$, $\lambda_k(1, 1)$ respectively. Operation of these component BMUs can be understood from a consideration of the component BMU for calculating $\lambda_k(0, 0)$ shown in FIG. 10. This BMU comprises a plurality of initial pipeline stages. The hypothesized input values $$z_k^h(\hat{u}_{k-1}^i, u_k^i) = u_k + h_1\hat{u}_{k-1} + h_2\hat{u}_{k-2} + h_3\hat{u}_{k-3} \forall u_k \in \mathbb{A}$$

are computed and selected from precomputed values, depending on previous symbol decisions, in the BMU over a number of these initial pipeline stages. These initial pipeline stages for computing the hypothesized input values are labeled "HVG" for convenience in the figure. For the $\chi_k=0$ to $\chi_{k+1}=0$ transition, all possible trellis transitions for calculating $\lambda_k(0, 0)$ are shown in FIG. 11. Since $\chi_k=0$ and $\chi_{k+1}=0$, $\hat{u}_{k-1} \in \{-3, +1\}$ and $\hat{u}_k \in \{-3, +1\}$. For the four trellis diagrams on the left $\hat{u}_{k-3} \in \{-3, +1\}$, and for the four trellis diagrams on the right $\hat{u}_{k-3} \in \{-1, +3\}$. Therefore, $\varsigma_{k-4}^I$ can be used to choose the contribution of $\hat{u}_{k-3}$ to $z_k^h(\hat{u}_{k-1}^i, u_k^i)$, and $\varsigma_{k-3}^I(\chi_{k-3}, \chi_{k-2})$ can be used to choose the contribution of $\hat{u}_{k-2}$ and $\hat{u}_{k-1}$ to $z_k^h(\hat{u}_{k-1}^i, u_k^i)$. As a result of the input and selection stages of the HVG here, the eight difference calculators in the figure give the distance between the input sample $z_k$ and respective ones of the eight hypothesized input values corresponding to the eight possible trellis transition sequences of FIG. 11. These are then compared in the digital comparators, and the smallest selected by the ensuing multiplexers. After the initial pipeline stages, the branch metric $\lambda_{k-3}(0, 0)$ is selected as the optimum (here smallest) difference consistent with the predetermined substate decision $^0\chi_{k-4}$ for the preceding input sample, as fed back by the PMU. This is output, together with the corresponding unresolved subset decision $\varsigma_{k-3}^I(0, 0)$, the latter being delayed by one clock period as before. The pipelining results in a number of clock periods of latency equal to the number of embedded post-cursor per-survivor decision-feedback taps (here three as an example) plus the number of symbols included in the state decision (here one as an example).

Figure 10:
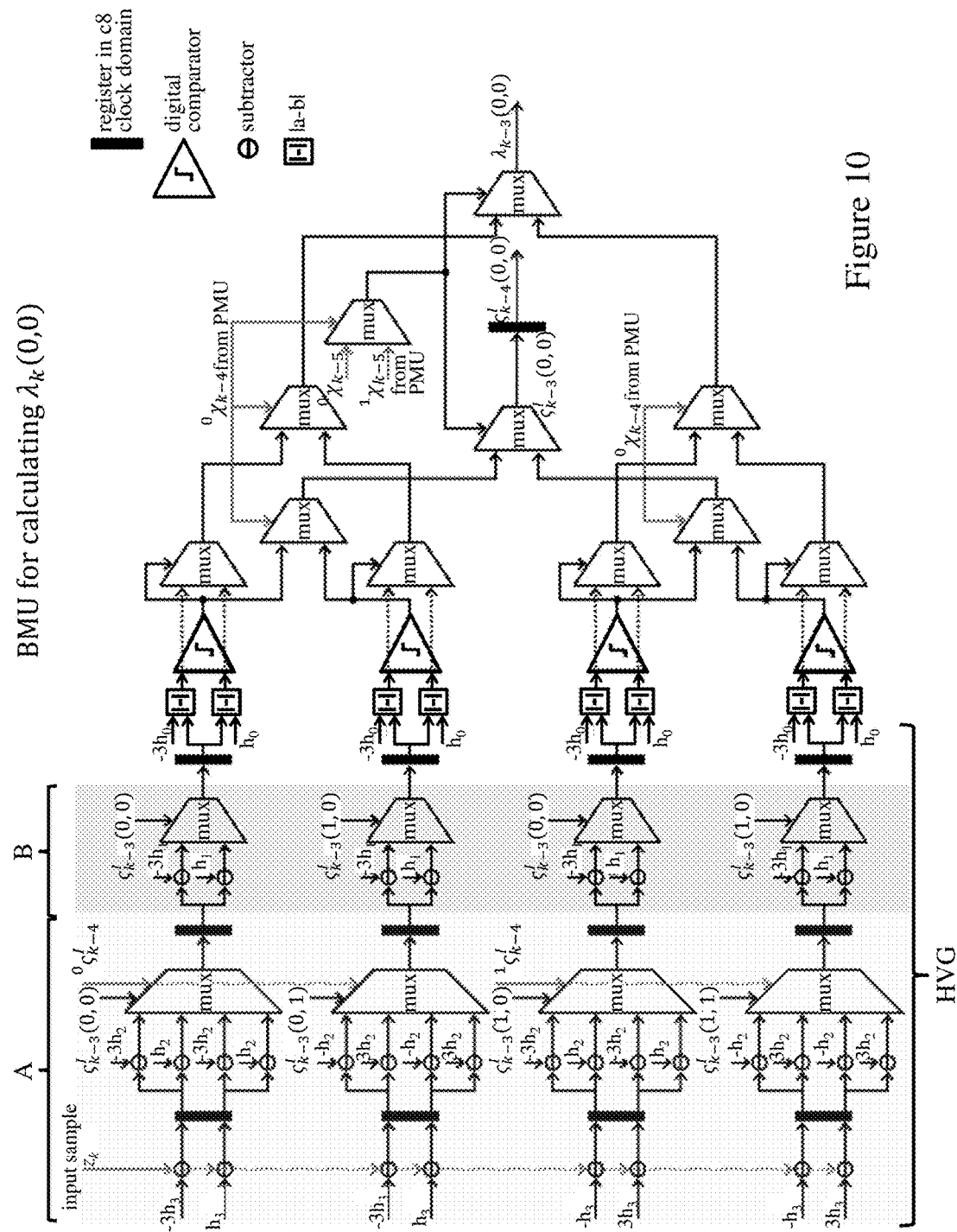
FIG. 10 is a schematic block diagram of a component of another branch metric unit according to one or more embodiments.

The corresponding inputs for the equivalent structures of the component BMUs for $\lambda_k(0, 1)$, $\lambda_k(1, 0)$ and $\lambda_k(1, 1)$ will be apparent to those skilled in the art. Note that the circuitry labelled A in FIG. 10 is identical, with the same inputs, for all component BMUs and therefore does not need to be replicated in a VLSI implementation. The circuitry labelled B has the same inputs for pairs of component BMUs, so this section B can be shared between the BMUs for $\lambda_k(0, 0)$ and $\lambda_k(0, 1)$, and the BMUs for $\lambda_k(1, 0)$ and $\lambda_k(1, 1)$. The PMU 3 is reproduced in FIG. 12 with the appropriate time-steps for the BMU operation here. The SMU 4 is reproduced in FIG. 13, again with the appropriate time-steps for this embodiment.

As with the first embodiment, it can be seen that the number of addition operations in the longest path of the detector is reduced to one. The embodiments described therefore substantially shorten the longest path in a Viterbi detector with an arbitrary number of embedded per-survivor decision-feedback taps. This breaks the bottleneck in metric calculations of Viterbi detectors operating over a channel with an arbitrarily long channel memory.

Various changes and modifications can of course be made to the exemplary embodiments described. For example, other difference measures, e.g. the squared Euclidean distance, could be used in the difference calculation step of the BMU. While the embodiments above implement RSSDs, the principles described can be applied to sequence detectors using a full-state trellis. In general, such a trellis may have any number of states as appropriate for the symbol constellation. Embodiments can also implement sequence detectors other than Viterbi detectors. For example, the principles described can be readily applied to trellis-coded-modulation decoders.

While the use of termination symbols simplifies detector architectures, termination symbols are not required for operation of detectors embodying the invention. The survivor paths from all possible starting states merge with high probability a number of iterations $\beta$ back in the trellis. The parameter $\beta$ is the well-known survivor path length. Similarly, when starting with unknown initial path metrics, which are typically set to zero, the path metrics after $\alpha$ trellis iterations are, with high probability, independent of the initial metrics; that is, the survivor paths will most likely merge with the true survivor sequence had the initial metrics been known. Modifications to account for the survivor path length at the end of an input sequence, in the absence of termination symbols, will be apparent to those skilled in the art.

The register exchange method, instead of the traceback method, is chosen as the memory organization technique for the storage of survivor paths in the SMU 5 above. This is because the traceback method needs more clock periods to traceback through the trellis, thus introducing latency. However, the SMU could be implemented by a traceback unit in modified embodiments if desired.

Steps of flow diagrams may be performed in a different order to that shown, and some steps may be performed concurrently, as appropriate.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e., occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

What is claimed is:

1. A sequence detector for detecting symbol values corresponding to a sequence of input samples received over a channel, the sequence detector comprising:
    a branch metric unit comprising an initial set of pipeline stages, wherein the branch metric unit is configured to:
        select hypothesized input values;
        compare the sequence of input samples with the hypothesized input values; and
        calculate, for each input sample, a respective set of one or more branch metrics based at least in part on the comparison of the sequence of input samples with the hypothesized input values; and
    a path metric unit, comprising a subsequent set of pipeline stages, wherein the path metric unit is configured to:
        receive each respective set of one or more branch metrics from the branch metric unit;
        determine, based at least in part on each respective set of one or more branch metrics, a respective state decision for a respective survivor path representing a respective possible symbol sequence corresponding to the sequence of input samples;
        update a respective set of one or more path metrics for each respective survivor path using, at least in part, the corresponding respective state decision and the corresponding respective set of one or more branch metrics; and
        determine a respective tentative symbol decision for each respective survivor path,
        wherein the respective set of one or more branch metrics are generated in the branch metric unit at a same time step in which the path metric unit determines a respective state decision for a preceding input sample.

2. The sequence detector of claim 1, further comprising:
    a survivor memory unit configured to:
    receive each respective state decision and each respective tentative symbol decision; and
        select a particular survivor path corresponding to the sequence of input samples.

3. The sequence detector of claim 2, wherein the survivor memory unit is configured to select the particular survivor path responsive, at least in part, to receipt of a reset signal indicative of a termination block at an end of the sequence of input samples.

4. The sequence detector of claim 2, wherein the survivor memory unit comprises a register exchange unit for storing a respective latest symbol value in each respective survivor path and, at the end of the sequence of input values, outputting symbol values in the selected particular survivor path.

5. The sequence detector of claim 4, wherein the survivor memory unit further comprises a traceback unit for determining the symbol values in the selected particular survivor path via traceback.

6. The sequence detector of claim 1, wherein each hypothesized input value is dependent, at least in part, on a respective possible symbol value for a respective corresponding input sample and $L>0$ previous respective symbol values corresponding to possible transitions between states of a trellis, and wherein the branch metric unit is further configured to select, as the respective branch metric for each possible transition, an optimum difference in dependence on a predetermined state in the respective corresponding survivor path through the trellis.

7. The sequence detector of claim 1, wherein the path metric unit is further configured to feed a particular respective state decision for a particular respective survivor path back to the branch metric unit to be used as a predetermined state for the particular respective survivor path for determining the respective set of one or more branch metrics for a subsequent input sample in the sequence of input samples.

8. A method for detecting symbol values corresponding to a sequence of input samples received over a channel, the method comprising:
    at a branch metric unit and during an initial set of pipeline stages:
        selecting hypothesized input values;
        comparing the sequence of input samples with the hypothesized input values; and
        calculating, for each input sample, a respective set of one or more branch metrics based at least in part on the comparison of the sequence of input samples with the hypothesized input values; and
    at a path metric unit and during a subsequent set of pipeline stages:
        receiving each respective set of one or more branch metrics from the branch metric unit;
        determining, based at least in part on each respective set of one or more branch metrics, a respective state decision for a respective survivor path representing a respective possible symbol sequence corresponding to the sequence of input samples;
        updating a respective set of one or more path metrics for each respective survivor path using, at least in part, the corresponding respective state decision and the corresponding respective set of one or more branch metrics; and
        determining a respective tentative symbol decision for each respective survivor path,
        wherein the respective set of one or more branch metrics are generated in the branch metric unit at a same time step in which the path metric unit determines a respective state decision for a preceding input sample.

9. The method of claim 8, further comprising:
    receiving, at a survivor memory unit, each respective state decision and each respective tentative symbol decision; and
    selecting, by the survivor memory unit, a particular survivor path corresponding to the sequence of input samples.

10. The method of claim 9, further comprising selecting, by the survivor memory unit, the particular survivor path responsive, at least in part, to receipt of a reset signal indicative of a termination block at an end of the sequence of input samples.

11. The method of claim 9, further comprising storing, by a register exchange unit of the survivor memory unit, a respective latest symbol value in each respective survivor path and, at the end of the sequence of input values, outputting symbol values in the selected particular survivor path.

12. The method of claim 11, further comprising determining, by a traceback unit of the survivor memory unit, the symbol values in the selected particular survivor path via traceback.

13. The method of claim 8, wherein each hypothesized input value is dependent, at least in part, on a respective possible symbol value for a respective corresponding input sample and L>0 previous respective symbol values corresponding to possible transitions between states of a trellis, the method further comprising selecting, at the branch metric unit, as the respective branch metric for each possible transition, an optimum difference in dependence on a predetermined state in the respective corresponding survivor path through the trellis.

14. The method of claim 8, further comprising feeding, by the path metric unit, a particular respective state decision for a particular respective survivor path back to the branch metric unit to be used as a predetermined state for the particular respective survivor path for determining the respective set of one or more branch metrics for a subsequent input sample in the sequence of input samples.

15. A computer program product for detecting symbol values corresponding to a sequence of input samples received over a channel, wherein the computer program product comprises a non-transitory computer readable storage medium having program instructions embodied therein, the program instructions being executable by a processing device to cause the processing device to perform a method comprising:
  selecting hypothesized input values;
  comparing the sequence of input samples with the hypothesized input values; and
  calculating, for each input sample, a respective set of one or more branch metrics based at least in part on the comparison of the sequence of input samples with the hypothesized input values; and
  determining, based at least in part on each respective set of one or more branch metrics, a respective state decision for a respective survivor path representing a respective possible symbol sequence corresponding to the sequence of input samples;
  updating a respective set of one or more path metrics for each respective survivor path using, at least in part, the corresponding respective state decision and the corresponding respective set of one or more branch metrics; and
  determining a respective tentative symbol decision for each respective survivor path,
  wherein the respective set of one or more branch metrics are generated in the branch metric unit at a same time step in which the path metric unit determines a respective state decision for a preceding input sample.

16. The computer program product of claim 15, the method further comprising:
  selecting, based at least in part on each respective state decision and each respective tentative symbol decision, a particular survivor path corresponding to the sequence of input samples.

17. The computer program product of claim 16, the method further comprising storing a respective latest symbol value in each respective survivor path and, at the end of the sequence of input values, outputting symbol values in the selected particular survivor path.

18. The computer program product of claim 17, the method further comprising determining the symbol values in the selected particular survivor path via traceback.

19. The computer program product of claim 15, wherein each hypothesized input value is dependent, at least in part, on a respective possible symbol value for a respective corresponding input sample and L>0 previous respective symbol values corresponding to possible transitions between states of a trellis, the method further comprising selecting, as the respective branch metric for each possible transition, an optimum difference in dependence on a predetermined state in the respective corresponding survivor path through the trellis.

20. The computer program product of claim 15, the method further comprising feeding a particular respective state decision for a particular respective survivor path back from a subsequent pipeline stage to an initial pipeline stage to be used as a predetermined state for the particular respective survivor path for determining the respective set of one or more branch metrics for a subsequent input sample in the sequence of input samples.

* * * * *